(12) United States Patent
Edelstein et al.

(10) Patent No.: US 9,064,874 B2
(45) Date of Patent: Jun. 23, 2015

(54) INTERCONNECT WITH TITANIUM—OXIDE DIFFUSION BARRIER

(71) Applicant: International Business Machines Corporation, Armonk, NY (US)

(72) Inventors: Daniel C. Edelstein, White Plains, NY (US); Takeshi Nogami, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 14/154,305

(22) Filed: Jan. 14, 2014

(65) Prior Publication Data

US 2014/0124934 A1    May 8, 2014

Related U.S. Application Data

(62) Division of application No. 13/474,944, filed on May 18, 2012, now abandoned.

(51) Int. Cl.
| | |
|---|---|
| *H01L 23/48* | (2006.01) |
| *H01L 29/40* | (2006.01) |
| *H01L 23/532* | (2006.01) |
| *H01L 23/522* | (2006.01) |

(52) U.S. Cl.
CPC ...... *H01L 23/53209* (2013.01); *H01L 23/5226* (2013.01); *H01L 23/53238* (2013.01); *H01L 2924/0002* (2013.01)

(58) Field of Classification Search
CPC .................................................. H01L 23/53209
USPC ........... 257/750–752, E21.584; 438/627, 700
See application file for complete search history.

(56) References Cited

U.S. PATENT DOCUMENTS

| | | | |
|---|---|---|---|
| 6,740,392 | B1 | 5/2004 | Farrar |
| 6,953,742 | B2 | 10/2005 | Chen et al. |

(Continued)

OTHER PUBLICATIONS

Edelstein et al., U.S. Appl. No. 13/474,944, filed May 18, 2012, entitled: "Interconnect With Titanium—Oxide Diffusion Barrier".

*Primary Examiner* — Theresa T Doan
(74) *Attorney, Agent, or Firm* — L. Jeffrey Kelly; Catherine Ivers

(57) ABSTRACT

An interconnect structure located on a semiconductor substrate within a dielectric material positioned atop the semiconductor substrate is provided having an opening within the dielectric material, the opening includes an electrically conductive material extending from the bottom to the top, and contacting the sidewall; a first layer located on the sidewall of the opening, the first layer is made from a material including titanium oxide or titanium silicon oxide; a second layer located between the first layer and the electrically conductive material, the second layer is made from a material selected from the group $TiXO_b$, $TiXSi_aO_b$, $XO_b$, and $XSi_aO_b$, X is Mn, Al, Sn, In, or Zr; and a third layer located along a top surface of the electrically conductive material, the third layer is made from a material selected from the group $TiXO_b$, $TiXSi_aO_b$, $XO_b$, and $XSi_aO_b$, X is Mn, Al, Sn, In, or Zr.

5 Claims, 3 Drawing Sheets

(56) References Cited

U.S. PATENT DOCUMENTS

| | | |
|---|---|---|
| 7,351,656 B2 | 4/2008 | Sakata et al. |
| 7,397,124 B2 | 7/2008 | Hu et al. |
| 7,405,153 B2 | 7/2008 | Malhotra et al. |
| 7,405,157 B1 | 7/2008 | Reid et al. |
| 7,498,242 B2 | 3/2009 | Kumar et al. |
| 7,994,055 B2 | 8/2011 | Sakai et al. |
| 8,035,230 B2 | 10/2011 | Arakawa |
| 8,039,966 B2 | 10/2011 | Yang et al. |
| 2005/0156315 A1 | 7/2005 | Lee et al. |
| 2009/0096102 A1 | 4/2009 | Gambino et al. |
| 2010/0200991 A1 | 8/2010 | Akolkar et al. |
| 2011/0101529 A1 | 5/2011 | Kao et al. |

INTERCONNECT WITH TITANIUM—OXIDE DIFFUSION BARRIER

CROSS REFERENCE

This application is a divisional of U.S. patent application Ser. No. 13/474,944, filed on May 18, 2012, which is incorporated here by reference in its entirety.

BACKGROUND

1. Field of the Invention

The present invention generally relates to integrated circuits, and more particularly to copper interconnect structures.

2. Background of Invention

In damascene processing or dual-damascene processing, an interconnect structure or wiring pattern can be formed within a dielectric layer. Using known techniques a photoresist material may be used to define the wiring pattern. The patterned photoresist acts as a mask through which a pattern of the dielectric material can be removed by a subtractive etch process such as plasma etching or reactive ion etching. The etched openings may be used to define wiring patterns in the dielectric layer. The wiring patterns may then be filled with a metal using a filling technique such as electroplating, electroless plating, chemical vapor deposition, physical vapor deposition or a combination thereof. Excess metal can then be removed by a chemical mechanical polishing process.

In a single damascene process, via openings may be provided in the dielectric layer and filled with a conducting metal, which may often be referred to as metallization, to provide electrical contact between layers of wiring levels. In a dual damascene process, the via openings and the wiring pattern are both provided in the dielectric layer before filling with the conducting metal. Damascene processing followed by metallization may be used for each layer until the integrated circuit device is completed.

Barrier layer films may be needed between the dielectric material and the conductive material in order to prevent atoms of the conductive material from migrating into and at times through the dielectric material and into other active circuit device structures. For example, barrier layers can be used in conjunction with conductive materials, such as those used in interconnect wiring layers, to isolate the conductive materials from the dielectric material. Migration of conductive material in the device can cause inter-level or intra-level shorts through the dielectric material. In some cases, device functionality can be destroyed. Due to device scaling, barrier layers may have thinner dimensions because of the smaller dimensions of the interconnect structures.

Migration is a particular concern when copper is used as the conductive interconnect material because copper exhibits relatively high mobility in dielectric materials used in semiconductor wire structures. Yet, in spite of this problem, copper is a favored material for interconnects because of its superior conductivity and good electromigration resistance. As a result, if copper is used in an interconnect structure, the copper may need to be confined by a barrier layer.

A barrier layer conventionally used in conjunction with copper interconnect structures may be tantalum and tantalum nitride. Alternatively, titanium and titanium nitride have been used as a barrier layer to prevent the migration of copper into the dielectric material, as well as a titanium or titanium oxide barrier layer. However, because these barrier materials are more reactive than copper, the formation of interfacial oxides can result in poor adhesion properties between the deposited copper and the barrier material. Due to the presence of the contaminating oxides, these conventional barrier materials usually require the deposition of a copper seed layer prior to standard copper electrodeposition in a copper acid bath. Electrodeposition of copper is generally only suitable for applying copper to an electrically conductive layer. As such, the copper seed layer provides the additional purpose of being electrically conductive to facilitate the electrodeposition of copper.

The copper seed layer may contain other materials such as manganese to add alloy-related enhancements to the Cu interconnect electromigration reliability. After copper is electrolytically deposited on top of a copper-manganese seed layer, the manganese atoms tend to migrate to a top surface of the electrically deposited copper. Migration of the manganese atoms improves electromigration reliability by providing a self-capping effect, which reduces Cu atom diffusivity along the Cu/cap interface. However, when a very thin tantalum nitride barrier layer is first deposited before the copper-manganese seed layer, some oxygen atoms from the dielectric material may breach the barrier layer and intrude into the electrically deposited copper. The oxygen may trap manganese atoms from the copper-manganese see layer, and prevent them from migrating to the top of the electrically deposited copper thereby reducing electromigration reliability.

SUMMARY

An interconnect structure located on a semiconductor substrate within a dielectric material positioned atop the semiconductor substrate is provided. The interconnect structure having an opening within the dielectric material, the opening including a bottom, a top, and a sidewall, wherein the opening includes an electrically conductive material extending from the bottom to the top, and contacting the sidewall, and a first layer located on the sidewall of the opening, wherein the first layer is made from a material including titanium oxide or titanium silicon oxide. The interconnect structure further having a second layer located between the first layer and the electrically conductive material, wherein the second layer is made from a material selected from the group consisting of $TiXO_b$, $TiXSi_aO_b$, $XO_b$, and $XSi_aO_b$, wherein X is Mn, Al, Sn, In, or Zr, and a third layer located along a top surface of the electrically conductive material, wherein the third layer is made from a material selected from the group consisting of $TiXO_b$, $TiXSi_aO_b$, $XO_b$, and $XSi_aO_b$, wherein X is Mn, Al, Sn, In, or Zr.

An interconnect structure located on a semiconductor substrate within a dielectric material positioned atop the semiconductor substrate is provided. The interconnect structure having an opening within the dielectric material, the opening including a bottom, a top, and a sidewall, wherein the opening includes an electrically conductive material extending from the bottom to the top, and contacting the sidewall, and a first layer located on the sidewall of the opening, wherein the first layer is made from a material including titanium oxide or titanium silicon oxide. The interconnect structure also having a second layer located between the first layer and the electrically conductive material; where in the second layer is made from a material selected from the group consisting of Ta, Co, Ru, TaTi, CoTi, and RuTi, and a third layer located along a top surface of the electrically conductive material, wherein the third layer is made from a material selected from the group consisting of $TiXO_b$, $TiXSi_aO_b$, $XO_b$, and $XSi_aO_b$, wherein X is Mn, Al, Sn, In, or Zr.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAIL DESCRIPTION

Detailed embodiments of the claimed structures and methods are disclosed herein; however, it is understood that the disclosed embodiments are merely illustrative of the claimed structures and methods that may be embodied in various forms. This disclosure may, however, be embodied in many different forms and should not be construed as limited to the exemplary embodiment set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Referring now to FIGS. 1-5, a single interconnect structure is shown. For purposes of clarity, any part of the structure located underneath or above the single interconnect is not shown. It should be understood that a plurality of wiring levels and interconnects may be present either above or below the single interconnect shown in FIGS. 1-5. It should also be understood that interconnects may be formed in, for example, a single or dual damascene opening and may include a via or a trench or both.

Figure 1:
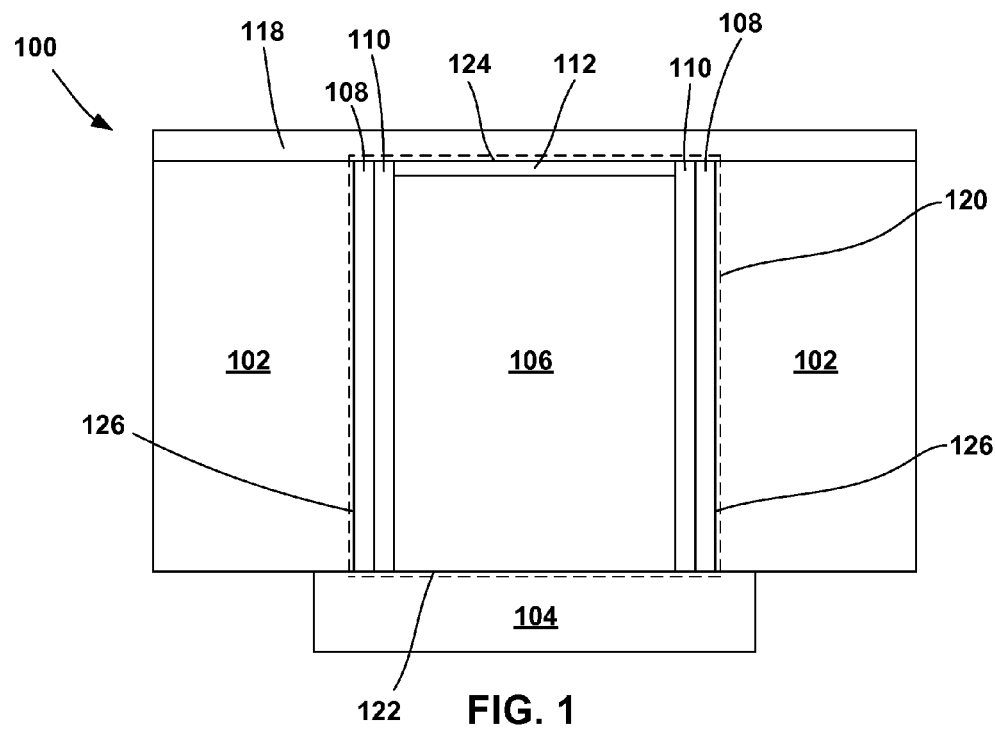
FIG. 1 is a vertical cross-sectional view of an interconnect structure according to one embodiment.

Referring now to FIG. 1, an interconnect 100 according to an exemplary embodiment is shown. The interconnect 100 may include an opening 120 in a dielectric material 102, where the opening 120 has a bottom 122, a top 124, and a sidewall 126. The sidewall 126 of the opening 120 can be defined by the dielectric material 102, while the bottom 122 of the opening 120 can be defined by a copper wire 104. Lining the sidewall 126 of the opening 120 is a first layer 108. For example, the first layer 108 may be made from titanium oxide. Alternatively, for example, the first layer 108 may be made from titanium silicon oxide. The first layer 108 may act as a diffusion barrier to protect an electronically conductive material 106 from contamination by the dielectric material 102. The first layer 108 made from either titanium oxide or titanium silicon oxide may function as a diffusion barrier to the electrically conductive material 106 at similar or smaller thicknesses than conventional diffusion barriers made from tantalum nitride. The first layer 108 may have a thickness ranging from about 0.5 nm to about 20 nm, although a thickness of the first layer 108 less than 0.5 nm or greater than 20 nm is conceivable. Preferably, the first layer 108 may have a thickness ranging from about 1 nm to 5 nm. A thinner first layer 108 provides for a decrease in resistance of the electrically conductive material 106 by permitting a larger volume of the electrically conductive material 106.

The electrically conductive material 106 fills the area defined by the copper wire 104, the second layer 110, and a third layer 112. The electrically conductive material 106 may be, for example, made from copper or any other suitable conductive material.

In one embodiment, titanium may react with oxygen from the dielectric material 102 to form the first layer 110. Because the oxygen from the dielectric material 102 reacts with the titanium, it may no longer react with manganese from a copper manganese seed layer. Therefore, the manganese from the copper manganese seed layer may migrate to the top of the conductive material 106, and thereby improve electromigration resistance.

Between the first layer 108 and the electrically conductive material 106 is a second layer 110. The second layer 110 may be made from, for example, a material including $TiXO_b$, $TiXSi_aO_b$, $XO_b$, or $XSi_aO_b$, where X may be Mn, Al, Sn, In, or Zr. The second layer 110 may have a thickness ranging from about 0.5 nm to about 20 nm, although a thickness of the second layer 110 less than 0.5 nm or greater than 20 nm is conceivable. Preferably, the second layer 110 may have a thickness ranging from about 1 nm to 5 nm.

The first layer 108 and the second layer 110 may together form a cohesive layer which may be graded from the compound of the first layer 108 to the compound of the second layer 110. In one embodiment the first layer 108 may be made from titanium oxide and the second layer 110 may be made from titanium manganese oxide in which the first layer 108 and the second layer 110 may form a cohesive layer which is graded from titanium oxide to titanium manganese oxide. Other material combinations are conceivable.

On top of the electrically conductive material 106 and at the top 124 of the opening 120 is a third layer 112. For example, the third layer 112 may be made from $TiXO_b$, $TiXSi_aO_b$, $XO_b$, or $XSi_aO_b$, where X may be Mn, Al, Sn, In, or Zr. The third layer 112 may include a thickness ranging from about 2 Å to about 100 Å, although a thickness of the third layer 112 less than 2 Å or greater than 100 Å is conceivable. Preferably, the third layer 112 may have a thickness ranging from about 5 Å to about 50 Å. The third layer 112 may improve the electromigration resistance characteristics as well as reduce electrical resistance of the interconnect 100.

A dielectric capping layer 118 may be formed on top of the dielectric material 102 and adjacent to the first layer 108, the second layer 110, and the third layer 112. The dielectric capping layer 118 may be used to insulate the multiple metallization layers from one another. For example, the dielectric capping layer 118 may be made from any suitable dielectric material.

Figure 2:
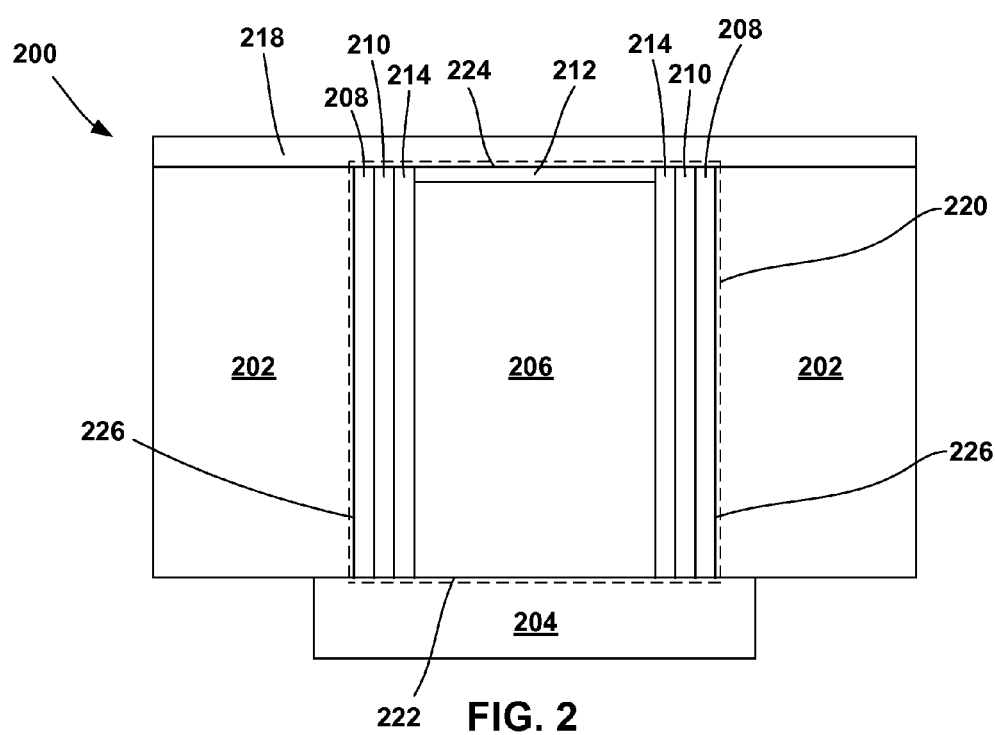
FIG. 2 is a vertical cross-sectional view of an interconnect structure according to another embodiment.

Referring now to FIG. 2, an interconnect 200 according to an exemplary embodiment is shown. The interconnect 200 may include an opening 220 in a dielectric material 202, where the opening 220 has a bottom 222, a top 224, and a sidewall 226. The sidewall 226 of the opening 220 can be defined by the dielectric material 202, while the bottom 222 of the opening 220 can be defined by a copper wire 204. Lining the sidewall 226 of the opening 220 is a first layer 208. For example, the first layer 208 may be made from titanium oxide. Alternatively, for example, the first layer 208 may be made from titanium silicon oxide. The first layer 208 may act as a diffusion barrier to protect an electronically conductive material 208 from contamination by the dielectric material 202. The first layer 208 made from either titanium oxide or titanium silicon oxide may function as a diffusion barrier to an electrically conductive material 206 at similar or smaller thicknesses than conventional diffusion barriers made from tantalum nitride. The first layer 208 may have a thickness ranging from about 0.5 nm to about 20 nm, although a thickness of the first layer 208 less than 0.5 nm or greater than 20 nm is conceivable. Preferably, the first layer 108 may have a thickness ranging from about 1 nm to 5 nm. A thinner first layer 208 provides for a decrease in resistance of the electrically conductive material 206 by permitting a larger volume of the electrically conductive material 206.

The electrically conductive material 206 fills the area defined by the copper wire 204, the second layer 210, and a third layer 212. The electrically conductive material 206 may be, for example, made from copper or any other suitable conductive material.

In one embodiment, titanium may react with oxygen from the dielectric material 202 to form the first layer 210. Because the oxygen from the dielectric material 202 reacts with the titanium, it may no longer react with manganese from a copper manganese seed layer. Therefore, the manganese from the copper manganese seed layer may migrate to the top of the conductive material 206, and thereby improve electromigration resistance.

Between the first layer 208 and the electrically conductive material 206 is a second layer 210. The second layer 210 may be made from, for example, a material including $TiXO_b$, $TiXSi_aO_b$, $XO_b$, or $XSi_aO_b$, where X may be Mn, Al, Sn, In, or Zr. The second layer 210 may have a thickness ranging from about 0.5 nm to about 20 nm, although a thickness of the second layer 210 less than 0.5 nm or greater than 20 nm is conceivable. Preferably, the second layer 210 may have a thickness ranging from about 1 nm to 5 nm.

The first layer 208 and the second layer 210 may together form a cohesive layer which may be graded from the compound of the first layer 208 to the compound of the second layer 210. In one embodiment the first layer 208 may be made from titanium oxide and the second layer 210 may be made from titanium manganese oxide in which the first layer 208 and the second layer 210 may form a cohesive layer which is graded from titanium oxide to titanium manganese oxide. Other material combinations are conceivable.

On top of the electrically conductive material 206 and at the top 224 of the opening 220 is a third layer 212. For example, the third layer 212 may be made from $TiXO_b$, $TiXSi_aO_b$, $XO_b$, or $XSi_aO_b$, where X may be Mn, Al, Sn, In, or Zr. The third layer 212 may include a thickness ranging from about 2 Å to about 100 Å, although a thickness of the third layer 212 less than 2 Å or greater than 100 Å is conceivable. Preferably, the third layer 212 may have a thickness ranging from about 5 Å to about 50 Å. The third layer 212 may improve the electromigration resistance characteristics as well as reduce electrical resistance of the interconnect 200.

Between the second layer 210 and the electrically conductive material 206 is a fourth layer 214. The fourth layer 214 may be made from, for example, a material including titanium and copper. The fourth layer 214 may have a thickness ranging from about 0.5 nm to about 20 nm, although a thickness of the fourth layer 214 less than 0.5 nm or greater than 20 nm is conceivable. Preferably, the fourth layer 214 may have a thickness ranging from about 1 nm to 5 nm.

A dielectric capping layer 218 may be formed on top of the dielectric material 202 and adjacent the first layer 208, the second layer 210, the third layer 212, and the fourth layer 214. The dielectric capping layer 218 may be used to insulate the multiple metallization layers from one another. For example, the dielectric capping layer 218 may be made from any suitable dielectric material.

Figure 3:
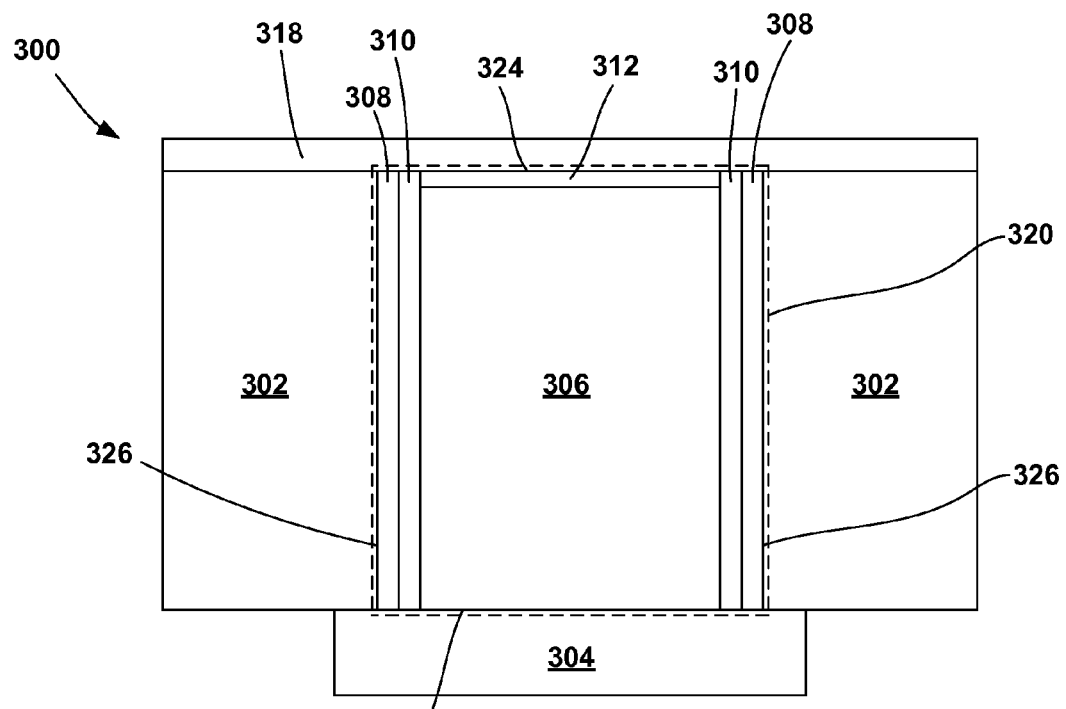
FIG. 3 is a vertical cross-sectional view of an interconnect structure according to another embodiment.

Referring now to FIG. 3, an interconnect 300 according to an exemplary embodiment is shown. The interconnect 300 may include an opening 320 in a dielectric material 302, where the opening 320 has a bottom 322, a top 324, and a sidewall 326. The sidewall 326 of the opening 320 can be defined by the dielectric material 302, while the bottom 322 of the opening 320 can be defined by a copper wire 304. Lining the sidewall 326 of the opening 320 is a first layer 308. For example, the first layer 308 may be made from titanium oxide. Alternatively, for example, the first layer 308 may be made from titanium silicon oxide. The first layer 308 may act as a diffusion barrier to protect an electronically conductive material 308 from contamination by the dielectric material 302. The first layer 308 made from either titanium oxide or titanium silicon oxide may function as a diffusion barrier to an electrically conductive material 306 at similar or smaller thicknesses than conventional diffusion barriers made from tantalum nitride. The first layer 308 may have a thickness ranging from about 0.5 nm to about 20 nm, although a thickness of the first layer 308 less than 0.5 nm or greater than 20 nm is conceivable. Preferably, the first layer 308 may have a thickness ranging from about 1 nm to 5 nm. A thinner first layer 308 provides for a decrease in resistance of the electrically conductive material 306 by permitting a larger volume of the electrically conductive material 306.

The electrically conductive material 306 fills the area defined by the copper wire 304, the second layer 310, and a third layer 312. The electrically conductive material 306 may be, for example, made from copper or any other suitable conductive material.

In one embodiment, titanium may react with oxygen from the dielectric material 302 to form the first layer 310. Because the oxygen from the dielectric material 302 reacts with the titanium, it may no longer react with manganese from a copper manganese seed layer. Therefore, the manganese from the copper manganese seed layer may migrate to the top of the conductive material 306, and thereby improve electromigration resistance.

Between the first layer 308 and the electrically conductive material 306 is a second layer 310. The second layer 310 may be made from, for example, a material including Ta, Co, Ru, TaTi, CoTi, or RuTi. The second layer 310 may have a thickness ranging from about 0.5 nm to about 20 nm, although a thickness of the second layer 310 less than 0.5 nm or greater than 20 nm is conceivable. Preferably, the second layer 310 may have a thickness ranging from about 1 nm to 5 nm.

On top of the electrically conductive material 306 and at the top 324 of the opening 320 is a third layer 312. For example, the third layer 312 may be made from $TiXO_b$, $TiXSi_aO_b$, $XO_b$, or $XSi_aO_b$, where X may be Mn, Al, Sn, In, or Zr. The third layer 312 may include a thickness ranging from about 2 Å to about 100 Å, although a thickness of the third layer 312 less than 2 Å or greater than 100 Å is conceivable. Preferably, the third layer 312 may have a thickness ranging from about 5 Å to about 50 Å. The third layer 312 may improve the electromigration resistance characteristics as well as reduce electrical resistance of the interconnect 300.

A dielectric capping layer 318 may be formed on top of the dielectric material 302 and adjacent to the first layer 308, the second layer 310, and the third layer 312. The capping layer 318 may be used to insulate the multiple metallization layers from one another. For example, the capping layer 318 may be made from any suitable dielectric material.

Figure 4:
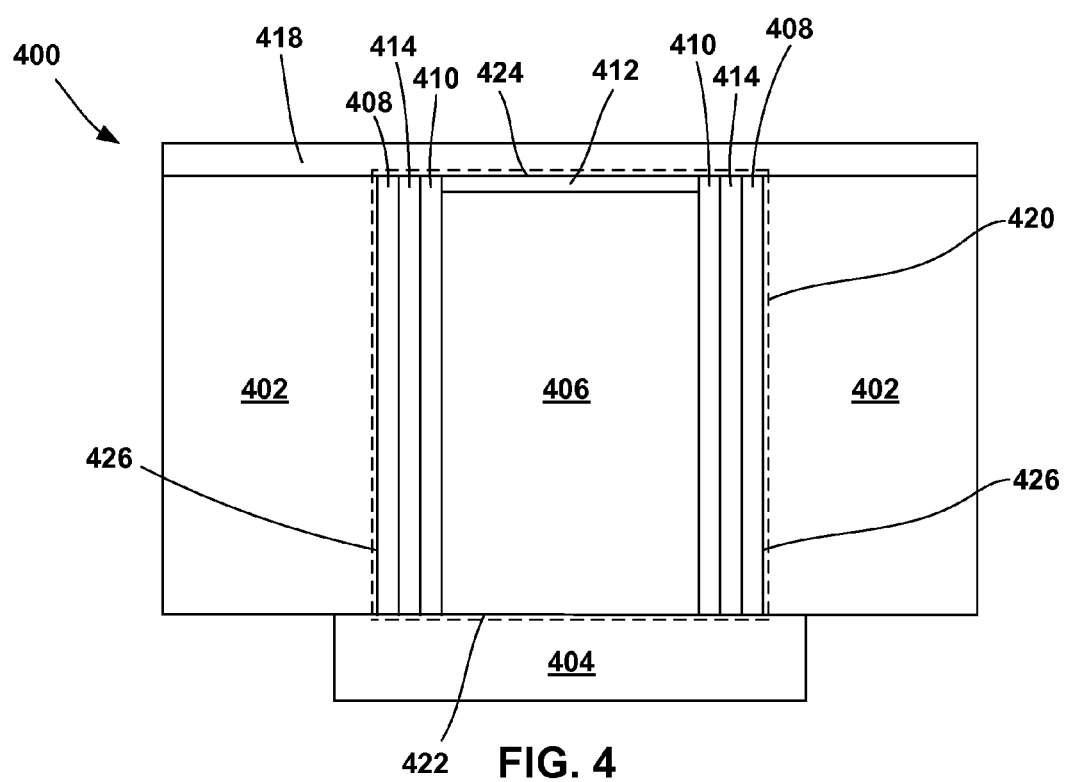
FIG. 4 is a vertical cross-sectional view of an interconnect structure according to another embodiment.

Referring now to FIG. 4, an interconnect 400 according to an exemplary embodiment is shown. The interconnect 400 may include an opening 420 in a dielectric material 402, where the opening 420 has a bottom 422, a top 424, and a sidewall 426. The sidewall 426 of the opening 420 can be defined by the dielectric material 402, while the bottom 422 of the opening 420 can be defined by a copper wire 404. Lining the sidewall 426 of the opening 420 is a first layer 408. For example, the first layer 408 may be made from titanium oxide. Alternatively, for example, the first layer 408 may be made from titanium silicon oxide. The first layer 408 may act as a diffusion barrier to protect an electronically conductive material 406 from contamination by the dielectric material 402. The first layer 408 made from either titanium oxide or titanium silicon oxide may function as a diffusion barrier to an electrically conductive material 406 at similar or smaller thicknesses than conventional diffusion barriers made from tantalum nitride. The first layer 408 may have a thickness ranging from about 0.5 nm to about 20 nm, although a thickness of the first layer 408 less than 0.5 nm or greater than 20 nm is conceivable. Preferably, the first layer 408 may have a thickness ranging from about 1 nm to 5 nm. A thinner first layer 408 provides for a decrease in resistance of the electrically conductive material 406 by permitting a larger volume of the electrically conductive material 406.

The electrically conductive material 406 fills the area defined by the copper wire 404, the second layer 410, and a third layer 412. The electrically conductive material 406 may be, for example, made from copper or any other suitable conductive material.

In one embodiment, titanium may react with oxygen from the dielectric material 402 to form the first layer 410. Because the oxygen from the dielectric material 402 reacts with the titanium, it may no longer react with manganese from a copper manganese seed layer. Therefore, the manganese from the copper manganese seed layer may migrate to the top of the conductive material 406, and thereby improve electromigration resistance.

Between the first layer 408 and the electrically conductive material 406 is a second layer 410. The second layer 410 may be made from, for example, a material including Ta, Co, Ru, TaTi, CoTi, or RuTi. The second layer 410 may have a thickness ranging from about 0.5 nm to about 20 nm, although a thickness of the second layer 410 less than 0.5 nm or greater than 20 nm is conceivable. Preferably, the second layer 410 may have a thickness ranging from about 1 nm to 5 nm.

On top of the electrically conductive material 406 and at the top 424 of the opening 420 is a third layer 412. For example, the third layer 412 may be made from $TiXO_b$, $TiXSi_aO_b$, $XO_b$, or $XSi_aO_b$, where X may be Mn, Al, Sn, In, or Zr. The third layer 412 may include a thickness ranging from about 2 Å to about 100 Å, although a thickness of the third layer 412 less than 2 Å or greater than 100 Å is conceivable. Preferably, the third layer 412 may have a thickness ranging from about 5 Å to about 50 Å. The third layer 412 may improve the electromigration resistance characteristics as well as reduce electrical resistance of the interconnect 400.

Between the first layer 408 and the second layer 410 is a fourth layer 414. The fourth layer 414 may be made from, for example, a material including $TiXO_b$, $TiXSi_aO_b$, $XO_b$, or $XSi_aO_b$, where X may be Mn, Al, Sn, In, or Zr. The fourth layer 414 may have a thickness ranging from about 0.5 nm to about 20 nm, although a thickness of the fourth layer 414 less than 0.5 nm or greater than 20 nm is conceivable. Preferably, the fourth layer 414 may have a thickness ranging from about 1 nm to 5 nm.

The first layer 408 and the fourth layer 414 may together form a cohesive layer which may be graded from the compound of the first layer 408 to the compound of the fourth layer 414. In one embodiment the first layer 408 may be made from titanium oxide and the fourth layer 414 may be made from titanium manganese oxide in which the first layer 408 and the fourth layer 414 may form a cohesive layer which is graded from titanium oxide to titanium manganese oxide. Other material combinations are conceivable.

A dielectric capping layer 418 may be formed on top of the dielectric material 402 and adjacent to the first layer 408, the second layer 410, the third layer 412, and the fourth layer 414. The dielectric capping layer 418 may be used to insulate the multiple metallization layers from one another. For example, the dielectric capping layer 418 may be made from any suitable dielectric material.

Figure 5:
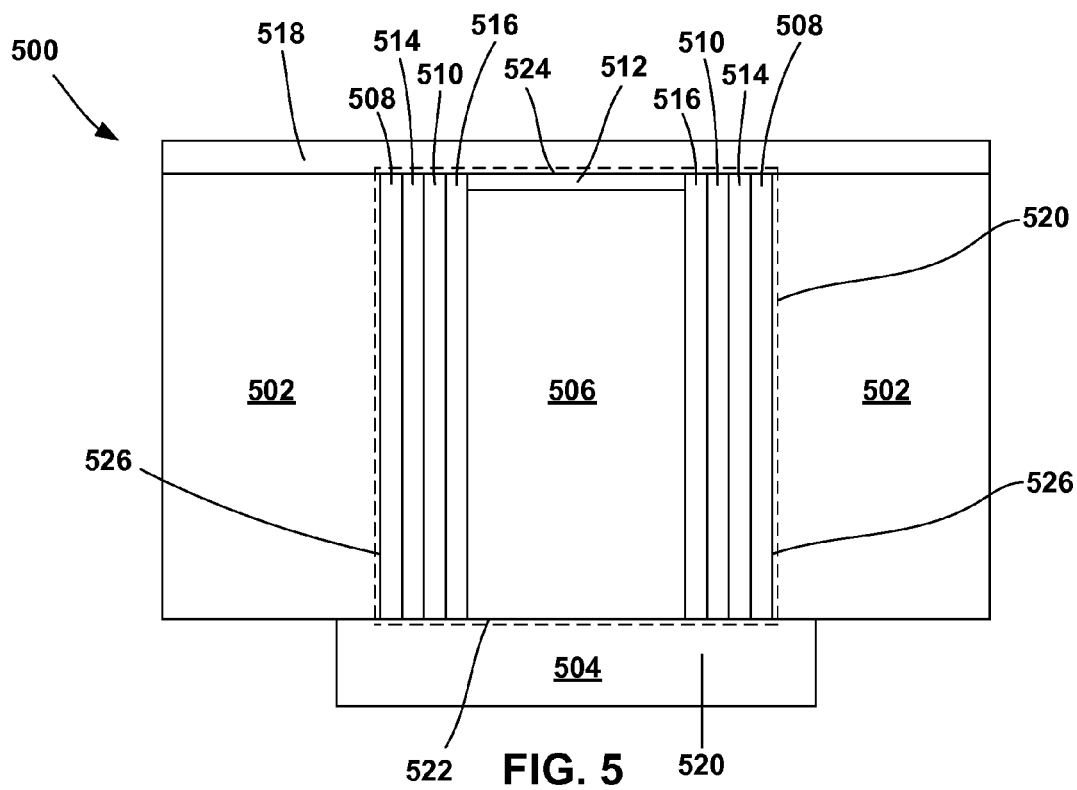
FIG. 5 is a vertical cross-sectional view of an interconnect structure according to another embodiment.

Referring now to FIG. 5, an interconnect 500 according to an exemplary embodiment is shown. The interconnect 500 may include an opening 520 in a dielectric material 502, where the opening 520 has a bottom 522, a top 524, and a sidewall 526. The sidewall 526 of the opening 520 can be defined by the dielectric material 502, while the bottom 522 of the opening 520 can be defined by a copper wire 504. Lining the sidewall 426 of the opening 520 is a first layer 508. For example, the first layer 508 may be made from titanium oxide. Alternatively, for example, the first layer 508 may be made from titanium silicon oxide. The first layer 508 may act as a diffusion barrier to protect an electronically conductive material 508 from contamination by the dielectric material 502. The first layer 508 made from either titanium oxide or titanium silicon oxide may function as a diffusion barrier to an electrically conductive material 506 at similar or smaller thicknesses than conventional diffusion barriers made from tantalum nitride. The first layer 508 may have a thickness ranging from about 0.5 nm to about 20 nm, although a thickness of the first layer 508 less than 0.5 nm or greater than 20 nm is conceivable. Preferably, the first layer 508 may have a thickness ranging from about 1 nm to 5 nm. A thinner first layer 508 provides for a decrease in resistance of the electrically conductive material 506 by permitting a larger volume of the electrically conductive material 506.

The electrically conductive material 506 fills the area defined by the copper wire 504, the second layer 510, and a third layer 512. The electrically conductive material 506 may be, for example, made from copper or any other suitable conductive material.

In one embodiment, titanium may react with oxygen from the dielectric material 502 to form the first layer 510. Because the oxygen from the dielectric material 502 reacts with the titanium, it may no longer react with manganese from a copper manganese seed layer. Therefore, the manganese from the copper manganese seed layer may migrate to the top of the conductive material 506, and thereby improve electromigration resistance.

Between the first layer 508 and the electrically conductive material 506 is a second layer 510. The second layer 510 may be made from, for example, a material including Ta, Co, Ru, TaTi, CoTi, or RuTi. The second layer 510 may have a thickness ranging from about 0.5 nm to about 20 nm, although a thickness of the second layer 510 less than 0.5 nm or greater than 20 nm is conceivable. Preferably, the second layer 510 may have a thickness ranging from about 1 nm to 5 nm.

On top of the electrically conductive material 506 and at the top 524 of the opening 520 is a third layer 512. For example, the third layer 512 may be made from $TiXO_b$, $TiXSi_aO_b$, $XO_b$, or $XSi_aO_b$, where X may be Mn, Al, Sn, In, or Zr. The third layer 512 may include a thickness ranging from about 2 Å to about 100 Å, although a thickness of the third layer 512 less than 2 Å or greater than 100 Å is conceivable. Preferably, the third layer 512 may have a thickness ranging from about 5 Å to about 50 Å. The third layer 512 may improve the electromigration resistance characteristics as well as reduce electrical resistance of the interconnect 500.

Between the first layer 508 and the second layer 510 is a fourth layer 514. The fourth layer 514 may be made from, for example, a material including $TiXO_b$, $TiXSi_aO_b$, $XO_b$, or $XSi_aO_b$, where X may be Mn, Al, Sn, In, or Zr. The fourth layer 514 may have a thickness ranging from about 0.5 nm to about 20 nm, although a thickness of the fourth layer 514 less than 0.5 nm or greater than 20 nm is conceivable. Preferably, the fourth layer 514 may have a thickness ranging from about 1 nm to 5 nm.

The first layer 508 and the fourth layer 514 may together form a cohesive layer which may be graded from the compound of the first layer 508 to the compound of the fourth layer 514. In one embodiment the first layer 508 may be made from titanium oxide and the fourth layer 514 may be made from titanium manganese oxide in which the first layer 508 and the fourth layer 514 may form a cohesive layer which is graded from titanium oxide to titanium manganese oxide. Other material combinations are conceivable.

Between the second layer 510 and the electrically conductive material 506 is a fifth layer 516. The fifth layer 516 may be made from, for example, a material including titanium and copper. The fifth layer 516 may have a thickness ranging from about 0.5 nm to about 20 nm, although a thickness of the fifth layer 516 less than 0.5 nm or greater than 20 nm is conceivable. Preferably, the fifth layer 516 may have a thickness ranging from about 1 nm to 5 nm.

A dielectric capping layer 518 may be formed on top of the dielectric material 502 and adjacent to the first layer 508, the second layer 510, the third layer 512, the fourth layer 514, and the fifth layer 516. The dielectric capping layer 518 may be used to insulate the multiple metallization layers from one another. For example, the dielectric capping layer 518 may be made from any suitable dielectric material.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

What is claimed is:

1. An interconnect structure located on a semiconductor substrate within a dielectric material positioned atop the semiconductor substrate, the interconnect structure comprising:
   an opening within the dielectric material, the opening including a bottom, a top, and a sidewall, wherein the opening comprises an electrically conductive material extending from the bottom to the top, and contacting the sidewall;
   a first layer located on the sidewall of the opening, wherein the first layer is made from a material comprising titanium oxide or titanium silicon oxide;
   a second layer located between the first layer and the electrically conductive material; where in the second layer is made from a material selected from the group consisting of Ta, Co, Ru, TaTi, CoTi, and RuTi; and
   a third layer located along a top surface of the electrically conductive material, wherein the third layer is made from a material selected from the group consisting of $TiXO_b$, $TiXSi_aO_b$, $XO_b$, and $XSi_aO_b$, wherein X is Mn, Al, Sn, In, or Zr.

2. The interconnect structure of claim 1, further comprising:
   a fourth layer located between the first layer and the second layer, wherein the fourth layer is made from a material selected from the group consisting of $TiXO_b$, $TiXSi_aO_b$, $XO_b$, and $XSi_aO_b$, wherein X is Mn, Al, Sn, In, or Zr.

3. The structure of claim 2, further comprising:
   a fifth layer located between the second layer and the electrically conductive material, wherein the fifth layer is made from a material comprising titanium and copper.

4. The interconnect structure of claim 1, further comprising:
   a dielectric capping layer located on a top surface of the dielectric material, and in direct contact with the first layer, the second layer, and the third layer.

5. The interconnect structure of claim 4, further comprising:
   a copper wire located at the bottom of the opening and in direct contact with the conductive material.

* * * * *